(12) United States Patent
Coriasso et al.

(10) Patent No.: US 10,958,041 B2
(45) Date of Patent: Mar. 23, 2021

(54) METHOD FOR MAKING A SEMICONDUCTOR LASER DIODE, AND LASER DIODE

(71) Applicant: PRIMA ELECTRO S.P.A, Moncalieri (IT)

(72) Inventors: Claudio Coriasso, Leini (IT);
Giancarlo Meneghini, Turin (IT);
Roberto Paoletti, Airasca (IT)

(73) Assignee: Prima Electro S.P.A., Moncalieri (IT)

( * ) Notice: Subject to any disclaimer, the term of this patent is extended or adjusted under 35 U.S.C. 154(b) by 0 days.

(21) Appl. No.: 16/047,914

(22) Filed: Jul. 27, 2018

(65) Prior Publication Data
US 2019/0036306 A1   Jan. 31, 2019

(30) Foreign Application Priority Data
Jul. 28, 2017 (IT) .......................... 102017000087052

(51) Int. Cl.
*H01S 5/125* (2006.01)
*H01S 5/12* (2006.01)
(Continued)

(52) U.S. Cl.
CPC ............ *H01S 5/125* (2013.01); *H01S 5/1203* (2013.01); *H01S 5/1237* (2013.01);
(Continued)

(58) Field of Classification Search
CPC ........ H01S 5/125; H01S 5/203; H01S 5/1237; H01S 5/2054; H01S 5/221; H01S 5/2222; H01S 5/3432
See application file for complete search history.

(56) References Cited

U.S. PATENT DOCUMENTS

| 4,720,468 A | * | 1/1988 | Menigaux | .......... G02B 6/12004 148/DIG. 95 |
| 4,993,036 A | * | 2/1991 | Ikeda | ..................... B82Y 20/00 372/102 |

(Continued)

OTHER PUBLICATIONS

Italian Search Report and Written Opinion dated Mar. 20, 2018, issued in Italian Application No. IT201700087052.

*Primary Examiner* — Dale E Page
*Assistant Examiner* — Quovaunda Jefferson
(74) *Attorney, Agent, or Firm* — Workman Nydegger

(57) ABSTRACT

A method for making a laser diode with a distributed grating reflector (RT) in a planar section of a semiconductor laser with stabilized wavelength includes providing a diode formed by a substrate (S), a first cladding layer (CL1) arranged on the substrate (S), an active layer (A) arranged on the first cladding layer (CL1) and adapted to emit a radiation, and a second cladding layer (CL2) arranged on the active layer (A), said cladding layers (CL1, CL2) being adapted to form a heterojunction to allow for efficient injection of current into the active layer (A) and optical confinement, and a contact layer. The manufacturing method provides for creating, on a first portion (ZA) of the device, a waveguide (GO) for confinement of the optical radiation and, on the remaining portion (ZP) of the device, two different gratings for light reflection and confinement. The two gratings define two different zones (R1, R2), wherein the first zone (R1) includes a grating of low order and high duty cycle, and is intended for reflection, and the second zone (R2) includes a grating of the same order, or a grating of a higher order than the previous one, and low duty cycle, and is mainly intended for light confinement. The waveguide (GO) for confining the optical radiation is implemented through a lithography and a subsequent etching, whereas the (Continued)

grating (RT) requires a high-resolution lithography and a shallow etching starting from a planar zone.

12 Claims, 9 Drawing Sheets

(51) Int. Cl.
  *H01S 5/20* (2006.01)
  *H01S 5/343* (2006.01)
  *H01S 5/22* (2006.01)
  *H01S 5/065* (2006.01)

(52) U.S. Cl.
  CPC .............. *H01S 5/2054* (2013.01); *H01S 5/22* (2013.01); *H01S 5/221* (2013.01); *H01S 5/2222* (2013.01); *H01S 5/3432* (2013.01); *H01S 5/0655* (2013.01); *H01S 5/1231* (2013.01); *H01S 5/2086* (2013.01); *H01S 5/34313* (2013.01)

(56) References Cited

U.S. PATENT DOCUMENTS

| | | | |
|---|---|---|---|
| 5,164,956 A | | 11/1992 | Lang |
| 5,673,284 A | * | 9/1997 | Congdon ........... G02B 6/12004 372/102 |
| 2006/0098781 A1 | * | 5/2006 | Bloom ................. G01N 23/207 378/119 |
| 2007/0133648 A1 | * | 6/2007 | Matsuda ................ B82Y 20/00 372/102 |

* cited by examiner

METHOD FOR MAKING A SEMICONDUCTOR LASER DIODE, AND LASER DIODE

CROSS-REFERENCE TO RELATED APPLICATIONS

This application claims priority to Italian Application No. 102017000087052, filed Jul. 28, 2017, which is incorporated herein by specific reference.

BACKGROUND OF THE INVENTION

1. The Field of the Invention

The present invention relates to a light source, in particular a semiconductor laser diode, and to a method for making it.

More in detail, the present invention relates to a method for making a laser diode with a distributed grating reflector (DBR, Distributed Bragg Reflector) in a planar section of a laser with stabilized wavelength.

2. The Relevant Technology

Bragg gratings are reflectors in a narrow spectral band characterized by periodic alternation of elements having a high refractive index and a low refractive index.

A laser diode is a semiconductor diode, the active material of which, consisting of a p-i-n heterojunction, allows obtaining optical gain within a wavelength range determined by the epitaxial structure of alloys of semiconductor materials it is composed of, and such heterojunction (optical medium) is inserted in a cavity that is resonant for the optical field.

Therefore, a laser diode typically has a multi-layer structure, which comprises, starting from the bottom, a substrate, at least one first cladding layer, an active layer, at least one second cladding layer and, finally, a contact layer.

The polarization inversion necessary for the laser emission is obtained through injection of current into the junction itself.

Laser diodes are extremely efficient sources of coherent light with high density of power and brilliance, and are widely used in opto-electronic devices.

The power emitted by semiconductor diodes may vary from a few tens or hundreds of milliwatts (in information transmission applications) to over ten Watts (in high-power diodes).

The technique which is most commonly used in order to stabilize the emission wavelength requires the use of external volumetric stabilizers (Bragg gratings on crystals or thin films).

Typically, a DBR laser diode comprises a waveguide Bragg grating outside the active cavity.

DBR laser diodes are widespread in several fields of application, e.g., telecommunications.

The waveguide and the grating are generally obtained by means of different manufacturing processes on non-planar structures, resulting in a number of technological complications.

Wavelength stabilization by means of a DBR grating in a high-power laser is the object of a prior Italian patent application no. 102016000018622 (UB2016A000994) by the same Applicant. In such a solution, the periodic structure that defines the Bragg grating is created within the second cladding layer.

As aforesaid, a structure with a distributed grating reflector (DBR, Distributed Bragg Reflector) in a high-power laser provides accurate control over the wavelength of the emitted beam, thus allowing, for example, the spectral combination of beams emitted by different laser diodes while preserving the quality of the resulting combined beam.

A simple process allowing, for example, the creation of a uniform grating by lithography and a single etching process through a lithographic mask would be particularly efficient for this purpose.

However, a uniform grating would not allow for lateral optical confinement (in the direction orthogonal to the propagation direction), thus implying divergence of the optical beam, which would result in optical insertion loss.

One possible traditional solution would be to effect the etching of the grating directly on the waveguide. However, such a solution might turn out to be particularly difficult from a technological viewpoint, e.g., because it would require a deep etching of a grating with a large aspect ratio on non-planar surfaces. Etching should occur both on the ridge that defines the waveguide and on the already etched sides thereof, which would therefore be located at a lower level.

Therefore, deep etching of a grating on non-planar surfaces would imply etching depth variations according to the zone being etched, requiring deeper etching at the ridge that forms the waveguide and shallower (or null) etching in the remaining zones. Such a solution is very difficult to implement and economically disadvantageous.

This is because the height difference between the various planes of the device can be significant (e.g., around one micron or more) and such as to seriously complicate the manufacturing process.

On the other hand, making a shallower etching at the ridge might not be sufficient to ensure the proper operation of the grating (since it might cause poor optical coupling between the optical beam being guided in the active layer and the grating).

Finally, the possible alternative of making two different etchings of different depth at different times would be technologically complex, leading to poor efficiency of the manufacturing process, which would turn out to be slow and non-optimized.

It is therefore the object of the present invention to propose a method for making a grating in a planar section of a semiconductor laser, such as to provide both spectral reflection around the wavelength of interest and lateral optical confinement, by modelling the grating in the regions at the sides of the guided zone.

This method is particularly suitable for, without however being limited to, high-power DBR (Distributed Bragg Reflector) semiconductor lasers, which utilize the control and stabilization of the emitted wavelength for material processing applications that require high brilliance.

The proposed method allows, with a single lithography and etching of the semiconductor, fabricating a Bragg reflector having the desired features, thus significantly simplifying the technological process.

Optical confinement is attained by lateral modelling of the grating during its definition, by using an appropriate nano-lithography technique such as, for example, Electron Beam Lithography (EBL).

SUMMARY OF THE INVENTION

The present invention concerns the possibility of creating the waveguide and the Bragg grating in a planar region by means of a simplified manufacturing process.

While no new functionalities are added, the same functionalities are however obtained in a more efficient manner compared with the case wherein the working regions are not planar.

Some embodiments of the present invention concern a laser-diode device and a method for making it which can overcome the drawbacks of the prior art.

BRIEF DESCRIPTION OF THE DRAWINGS

Further features and advantages of the invention will be illustrated in the following detailed description, which is provided merely by way of non-limiting example with reference to the annexed drawings, wherein.

DETAILED DESCRIPTION OF THE PREFERRED EMBODIMENTS

The following description will illustrate various specific details useful for a deep understanding of some examples of one or more embodiments. The embodiments may be implemented without one or more of such specific details or with other methods, components, materials, etc. In other cases, some known structures, materials or operations will not be shown or described in detail in order to avoid overshadowing various aspects of the embodiments. Any reference to "an embodiment" in this description will indicate that a particular configuration, structure or feature is comprised in at least one embodiment. Therefore, the phrase "in an embodiment" and other similar phrases, which may be present in different parts of this description, will not necessarily be all related to the same embodiment. Furthermore, any particular configuration, structure or feature may be combined in one or more embodiments as deemed appropriate.

The references below are therefore used only for simplicity's sake, and do not limit the protection scope or extension of the various embodiments.

In brief, the laser diode according to the present invention integrates a periodic structure or grating, e.g., a Bragg reflector mirror, in order to stabilize the wavelength emitted by the diode itself, and allows obtaining efficient wavelength multiplexing, particularly for direct diode material processing applications.

Figure 1A:
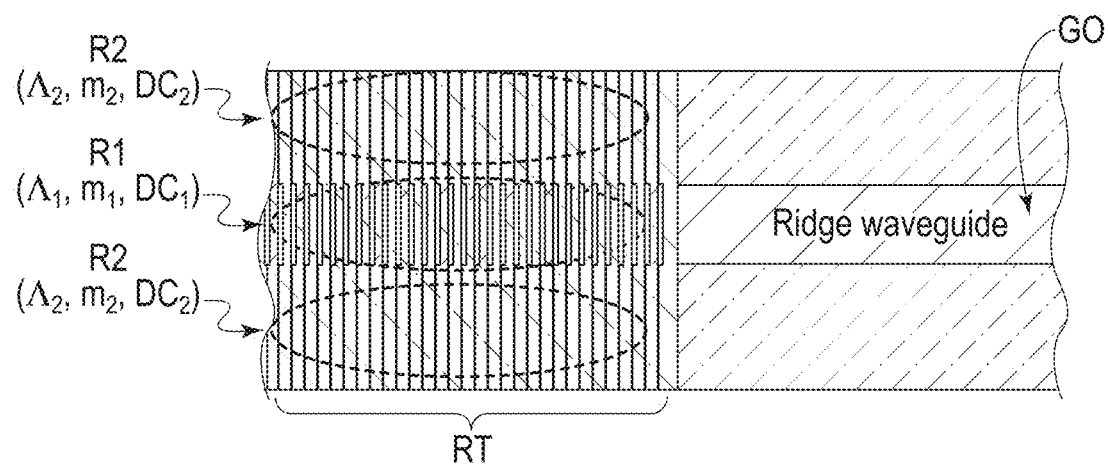
FIG. 1a shows a schematic top view of a laser-diode device according to the present invention, with a modelling of the external grating R2(m2, DC2) different from that of the internal grating R1(m1, DC1), where mi represents the order of the grating and DCi represents the duty cycle, i.e., the ratio between the filled space and the empty space in one period of the grating.

The structure proposed herein is shown, in a schematic top view, in FIG. 1a.

This is a DBR laser, wherein it is possible to discern a waveguide that defines an active region, indicated as G0, while reference RT designates as a whole a periodic grating structure that defines a passive zone of the DBR.

Such periodic structure RT is used for wavelength selection and stabilization and for lateral light confinement.

The passive zone that defines the grating RT comprises two different Bragg gratings that define, in the passive zone, two zones designated as R1 and R2, respectively.

In particular, the zone R1 is intended for and dedicated to wavelength selection and stabilization, whereas the two lateral zones R2 are mainly intended for and dedicated to lateral light confinement, even though they reflect within the same spectral range as the grating in the zone R1.

Figure 1D:
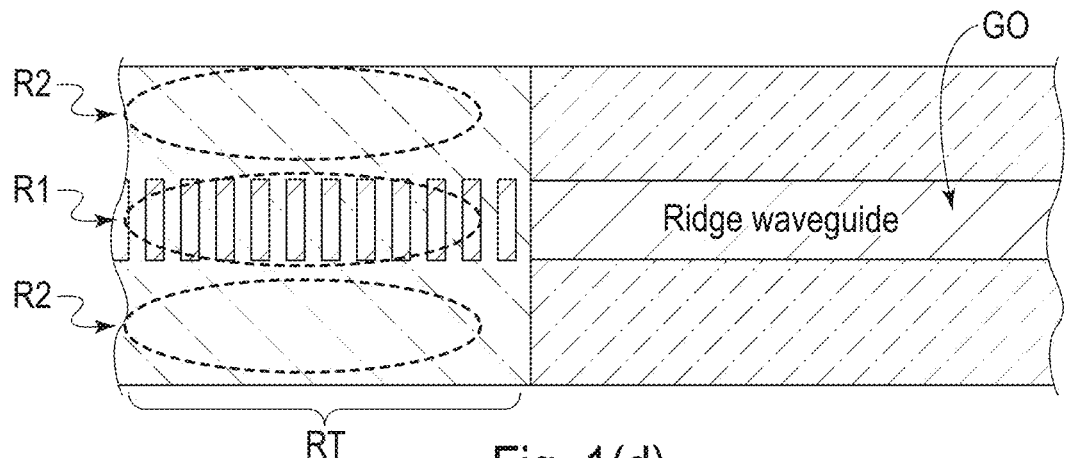
FIGS. 1b, 1c, 1d show some top views of a chip whereon the laser-diode device according to the present invention has been obtained, with different modellings of the external grating. The different modellings shown refer to a higher order and a low duty cycle (FIG. 1b), the same order and a low duty cycle (FIG. 1c), and a null duty cycle, i.e., absence of an external grating (FIG. 1d). The modelling of the external grating allows controlling the lateral optical confinement, which is an important parameter when designing a laser diode, and which reaches its maximum in the configuration with null duty cycle (FIG. 1d)
Figure 1C:
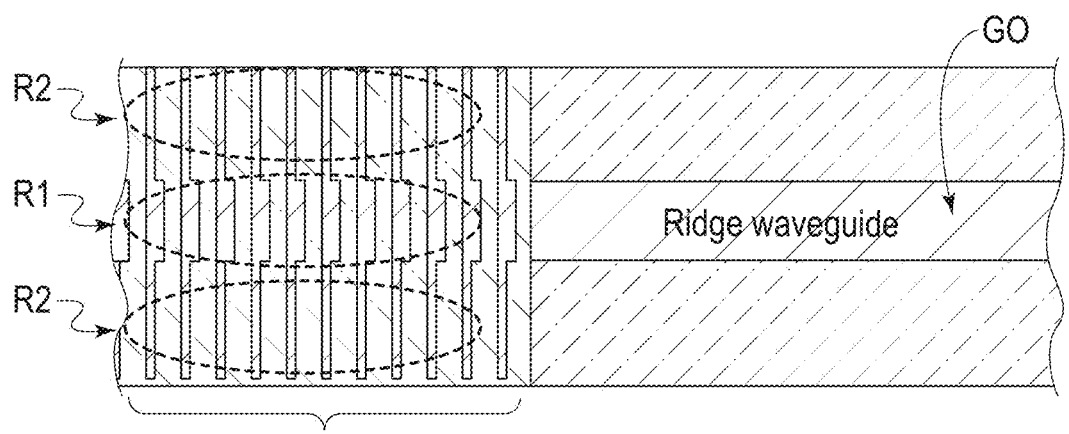
Figure 1B:
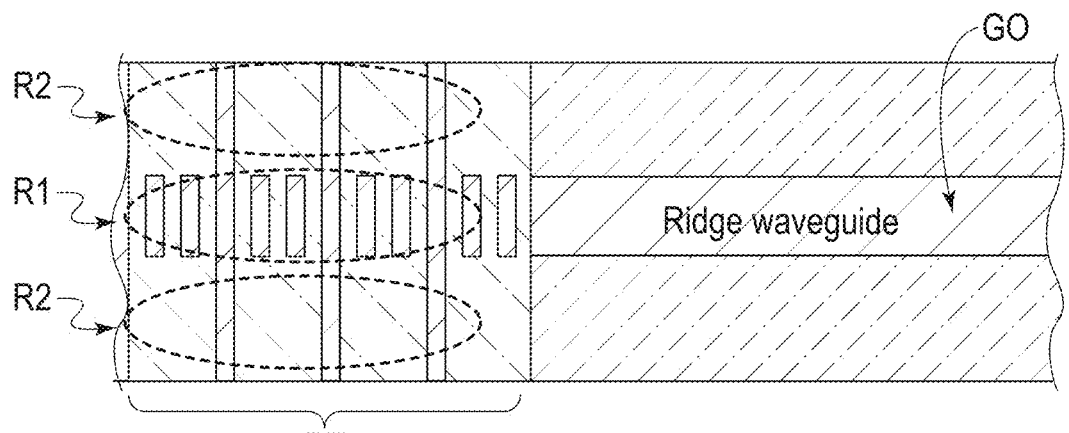

For example, in an exemplary embodiment illustrated in FIG. 1b there is a grating R1 of low order (e.g., order 1) and high duty cycle (e.g., ½), and a grating of high order R2 (e.g., order 3) and low duty cycle (e.g., ⅙).

Several solutions have been analyzed, and the one described above appears to be the best one for the fabricated structure. In particular, the above-described solution allows for light confinement in the zone R1 by using a low duty cycle and a different order of the Bragg grating.

Some alternatives can nevertheless be conceived, and in particular the zone R2 can be created:

a) with a low duty cycle and the same order as the grating of zone R1, see FIG. 1c; or b) with a null duty cycle, see FIG. 1d. In this case, the grating is only present in the zone R1, and the zone R2 performs only the optical confinement function, not the reflection function.

Case a) provides a solution that is more effective in reflection and less effective in lateral light confinement.

Case b) provides a solution that is more effective in lateral light confinement and less effective in reflection.

The reduced volume of semiconductor material in the zones external to the ideal continuation of the active waveguide (zones indicated by reference R2) allows confining the light laterally, thanks to the lower effective refractive index generated by the different, or even null, duty cycle and, possibly, the different order of the grating with respect to the zone R1.

Unlike more traditional solutions, which may suffer from the drawback of requiring complex on-wafer lithographies, with non-planar morphologies (e.g., ridge or buried-ridge structures for creating the active waveguide) or rather deep etchings with aspect ratios that are difficult to obtain, the proposed solution proves to be particularly advantageous because it requires only one high-resolution lithography and only one shallow etching starting from a planar zone.

Figure 2:
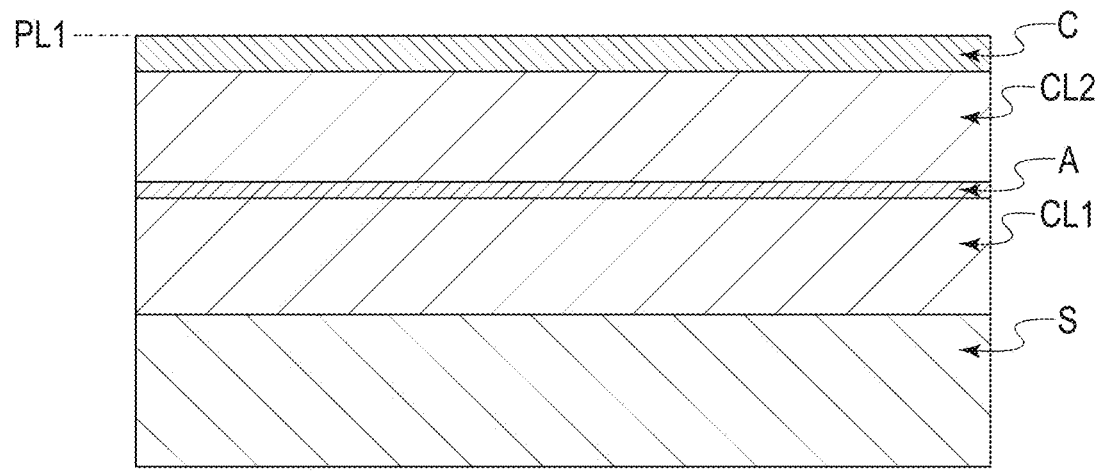
FIG. 2 shows a sectional view of the semiconductor epitaxial structure prior to the application of the method for obtaining the laser-diode device according to the present invention.

With reference to FIG. 2, the laser-diode device according to the present invention is obtained by processing a semifinished wafer that comprises, starting from the bottom, a substrate S, at least one first cladding layer CL1 arranged on the substrate S, an active layer A arranged on the first cladding layer CL1 and adapted to emit the laser radiation, at least one second cladding layer CL2 arranged on the active layer A, and a contact layer C.

The cladding layers CL1 and CL2 are adapted to form a heterojunction, thereby allowing efficient injection of current and vertical optical confinement in the active layer A.

In one embodiment, the diode illustrated in its section in FIG. 2 comprises a substrate S, e.g., made of gallium arsenide (GaAs), whereon, for example, a first cladding layer CL1, an active layer A, and a second cladding layer CL2 are progressively deposited by means of deposition techniques known to a person skilled in the art.

The active layer A is preferably a quantum well structure adapted to generate optical gain within a broad wavelength range. The cladding layers CL1 and CL2 are layers of semiconductor material, e.g., aluminium gallium arsenide AlGaAs, which incorporate the quantum well structure and which are adapted to form a heterojunction (following p or n doping, which is per se known to a person skilled in the art), thereby allowing for efficient injection of current into the quantum well structure and vertical optical confinement.

In particular, in the manufacturing method that will be described in detail hereinafter, starting from a semifinished wafer like the one shown in FIG. 2, a structure like the one shown in FIGS. 3a,3b, 3c and 3d is created.

Figure 3A:
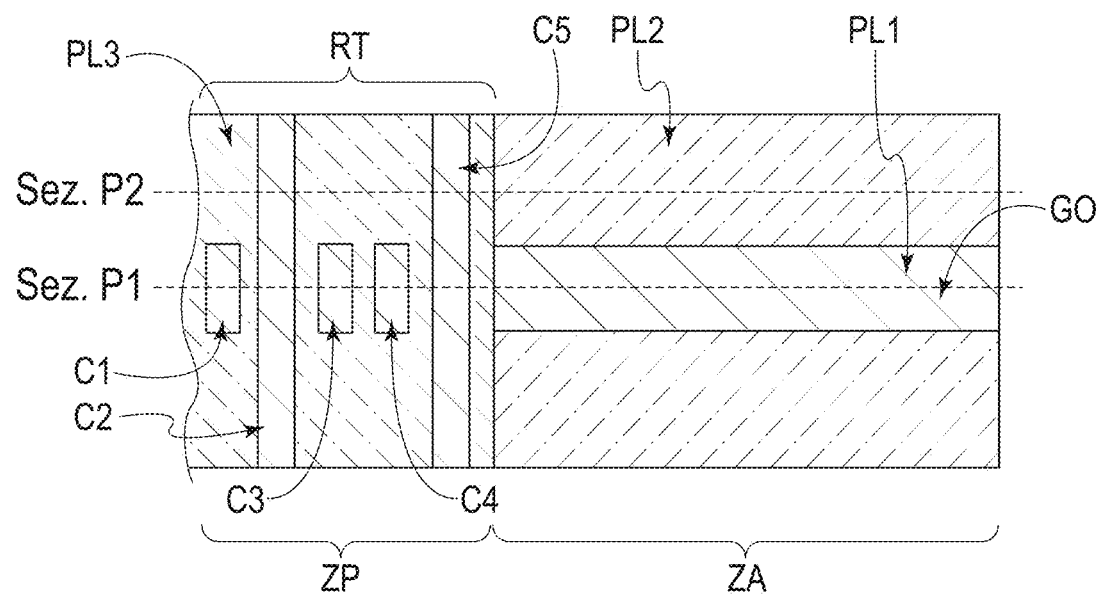
FIGS. 3a, 3b, 3c and 3d are, in particular, a top view, a sectional view at the centre of the waveguide (Sect. P1), and two sectional views in the external region (Sect. P2) of two alternative embodiments of the laser-diode device according to the present invention.

With reference to FIG. 3a, it is possible to identify an active zone ZA that comprises the waveguide GO obtained in the upper layers CL2 and C, and a passive zone ZP that comprises the grating RT created in the cladding CL2.

Figure 3B:
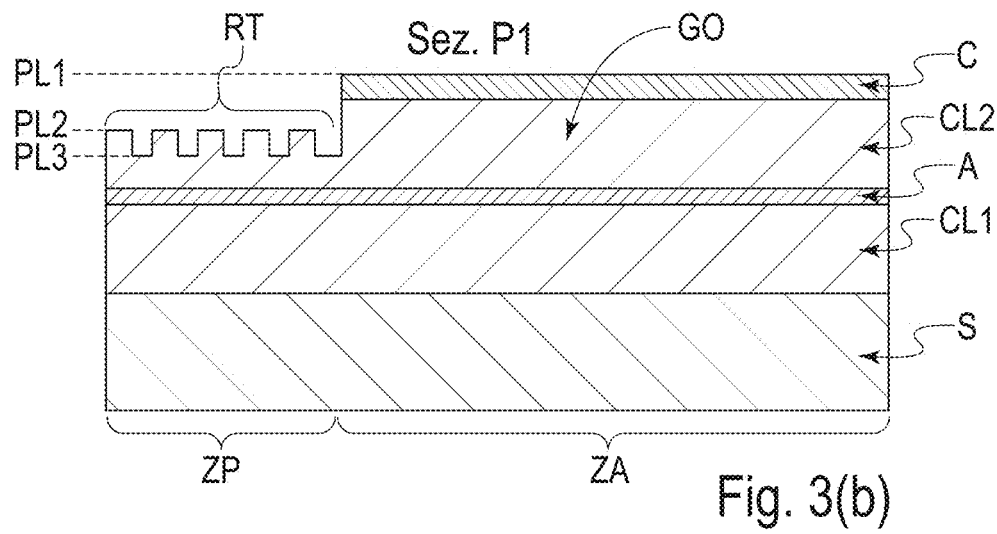
Figure 3C:
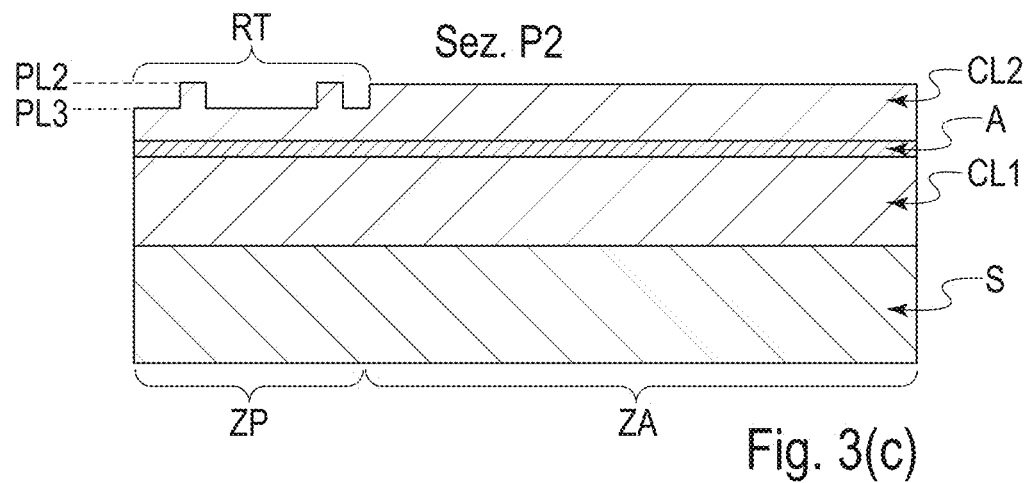
Figure 3D:
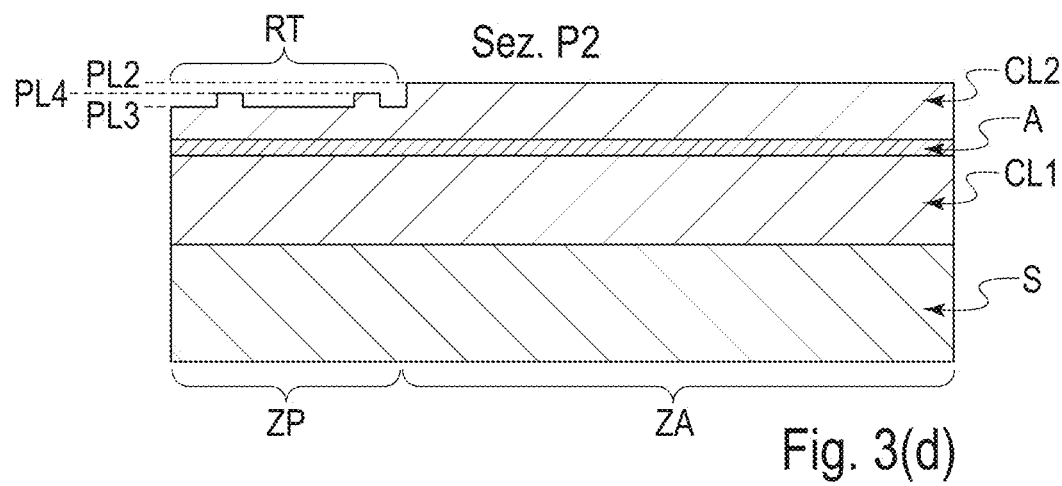

More in detail, FIG. 3a is a top view of the device to be obtained, FIG. 3b is a side view at the section P1, and FIGS. 3c, 3d are side views at the section P2. Sections P1 and P2 are illustrated in FIG. 3a.

In particular, in FIG. 3a the waveguide GO is a ridge formed by optical lithography and chemical etching by removing the contact layer C and a part of the cladding C2 all around the region GO.

Ridges are also present—in this non-limiting example five of them are indicated: C1, C2, C3, C4 and C5—which form the grating RT. These five ridges C1, C2, C3, C4 and C5 lie in the same plane as the lateral portions PL2 at the sides of the ridge GO that defines the waveguide. Finally, the remaining part PL3 is located at a lower level than the level of the lateral portions PL2 and of the ridges C1, C2, C3, C4 and C5 forming the grating RT.

In substance, the device thus obtained extends in three different planes, and in particular the highest plane PL1 is the one of the ridge that forms the waveguide GO, the intermediate plane PL2 is defined by the ridges C1, C2, C3, C4 and C5 that form the grating RT and by the lateral portions of the waveguide, and the lowest plane PL3 is represented by the zone around the grating RT.

It is however conceivable that the device has further planes or levels; for example, it is conceivable that the ridges forming the grating are at a lower level, indicated as PL4 in FIG. 3d, than the level PL2 of the lateral zones of the ridge GO.

Of course, the term "lower" refers to a level which is lower than another level in the representation shown in the drawings. For example, it can be said that in the structure of FIG. 3b the cladding layer CL1 is at a lower level than the cladding layer CL2.

Thus, with reference to FIGS. 3a and 3b, the ridges C1, C2, C3, C4 and C5 define elements of semiconductor material with a high refractive index which alternate with empty sections, so as to create the Bragg grating, i.e., a structure of periodic variation of the refractive index.

In the solution proposed herein, the lateral parts of the Bragg grating, indicated in FIG. 1a by reference R2, (with a low duty cycle and, optionally, a higher grating order) act as a lateral optical cladding, providing for optical beam confinement and overcoming the problem of optical losses.

This grating modelling can be implemented by using an appropriate nanolithography technique, such as nanoimprinting or Electron Beam Lithography, which are conventional techniques for the fabrication of gratings defined on semiconductor wafers.

The proposed solution is schematically shown in FIG. 1a, where $\Lambda_i = m_i \lambda_B / 2n$ is the period of the grating, "$\lambda B$" is the Bragg wavelength, "n" is the effective refractive index of the waveguide, "mi" is the order of the grating, and DCi is the duty cycle (i=1 for the guided region, i=2 for the external region).

Calculations based on the transfer matrix method show that, for high-power quantum-well laser structures, the lateral optical confinement (zones R2) obtained with low duty cycles and, optionally, higher grating orders may turn out to be similar to that obtained with standard waveguide structures, e.g., wide-area ridge structures:

Grating in the guided region: m=1, ν=0.5
Grating in the external region: m=3, ν=⅙
Lateral confinement=$\Delta n_{lat}$=1.8*10$^{-3}$.

The wavelength of the output beam is related, in a per se known manner, to the pitch of the grating of the periodic structure or grating RT.

Figure 4:
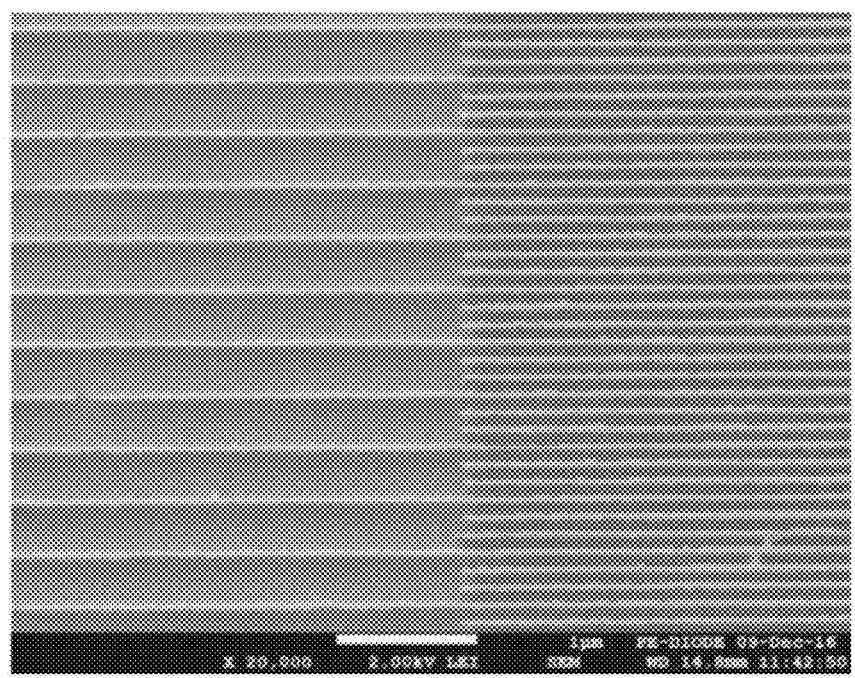
FIG. 4 shows a image, obtained with a scanning electron microscope, of the Bragg grating of a laser-diode device made in accordance with the present invention.

FIG. 4 shows an image, obtained under a scanning electron microscope, of a DBR fabricated with a grating of the first order and DC=½ in the waveguide region and a grating of the third order and DC=⅙ in the lateral region in order to attain optical confinement.

The parameters of this DBR are:
Grating R1 (First Order):
  λ=0.92 μm
  $m_1$=1
  $\Lambda_1$=130 nm
  DC=½
  65 nm wide ridge, 65 nm wide groove
Grating R2 (Third Order):
  $m_2$=3
  $\Lambda_2 = m_2 * \Lambda_1 = 3 * 130$ nm=390 nm
  DC=⅙
  65 nm wide ridge, 325 nm wide groove.

Figure 5:
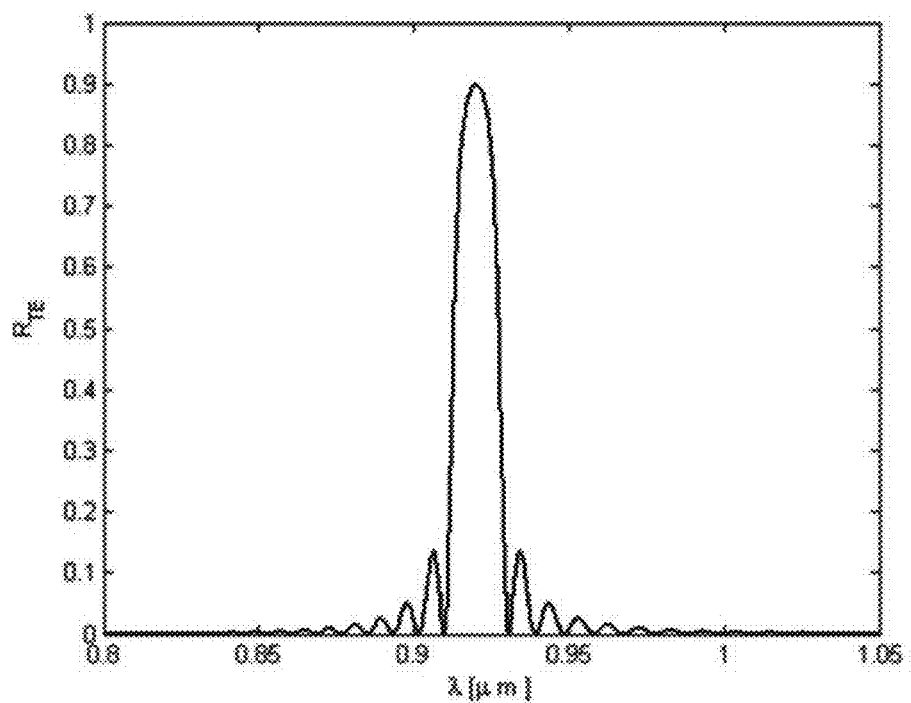
FIG. 5 shows the spectral reflectivity of a laser-diode device according to the present invention.

FIG. 5 shows the spectral reflectivity of a DBR grating with λ=0.92 μm, wherein it can be noted that the grating is highly reflective only for a very narrow wavelength range (approx. 15 nm around λ=0.92 μm).

The following will describe an example of a possible method of making a laser diode according to the present invention.

Figures 6A, 6B:
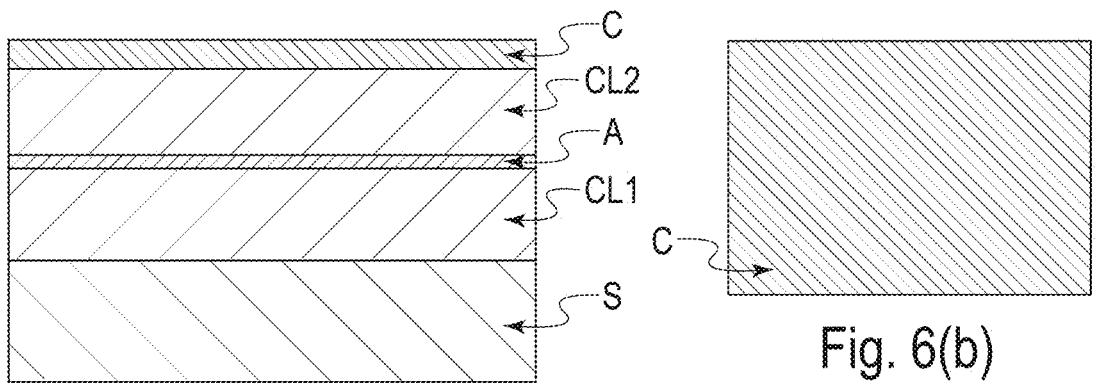
FIGS. 6(a,b), 7(a,b), 8(a,b), 9(a,b) and 10(a,b) show the subsequent steps of the method for obtaining the laser-diode device according to the present invention; in particular, Figures "a" are longitudinal sections at the waveguide, whereas Figures "b" are top views.

FIG. 6a shows a side view of the starting device with the active layer A and the two cladding layers CL1 and CL2, the substrate S, and the contact C.

FIG. 6b shows a top view of the device, wherein only the contact layer C is visible.

The first step of the manufacturing method is forming the waveguide GO.

Figures 7A, 7B:
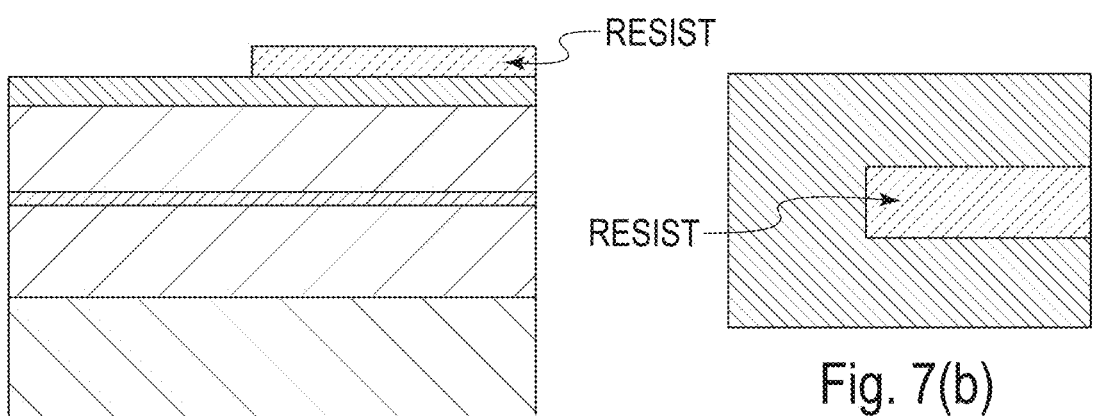

In particular, as illustrated in FIGS. 7a and 7b, a suitable layer of resist is deposited onto the contact layer C, and then a lithography and an etching are carried out in order to define the active guide GO.

FIGS. 7a and 7b show the resist mask resulting from the lithography, for protecting the underlying part. Therefore, the next step of etching the semiconductor through the resist mask models the waveguide GO in the upper wafer layers C, CL2.

Figures 8A, 8B:
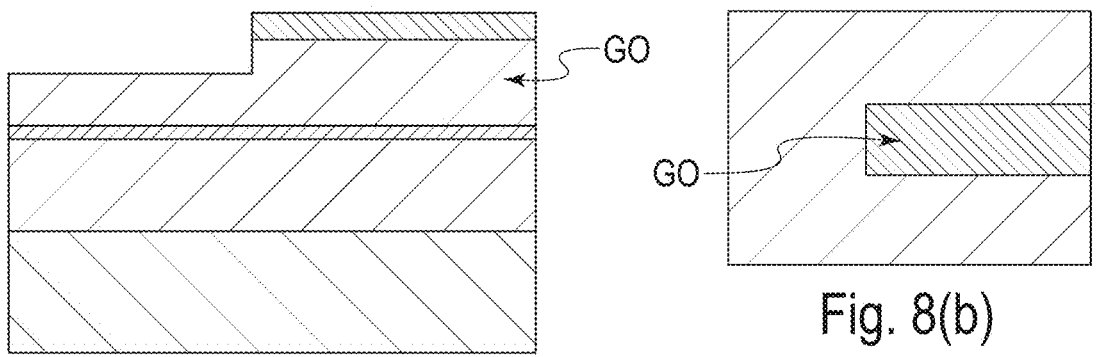

In the next step, the resist mask is removed and the structure shown in FIGS. 8a and 8b is obtained. In particular, all around the waveguide GO (which is shaped as a ridge raised from the rest of the wafer) the upper layers have been etched and partially removed.

Figure 9A:
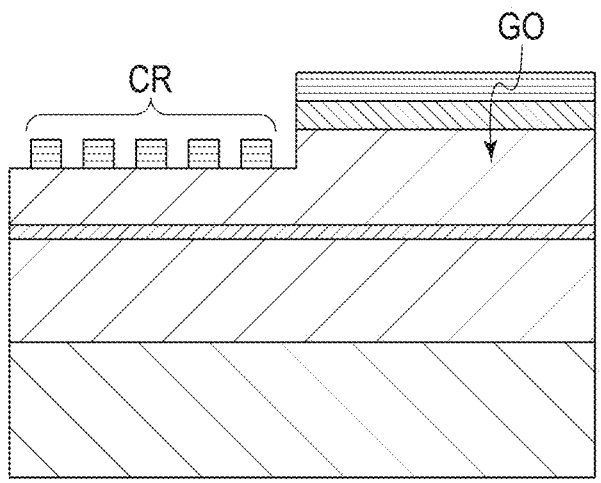
Figure 9B:
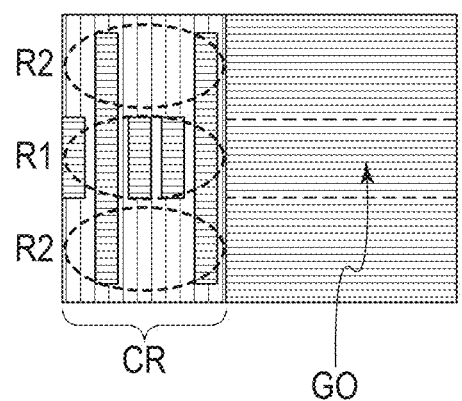

In FIGS. 9a and 9b the grating is formed. In particular, during a further manufacturing step a suitable layer of resist is deposited in order to define the ridges CR of the grating RT.

Afterwards, the next high-resolution lithography step serves to define the two different areas of the grating (zones R1 and R2). The first one (zone R1) with the grating of low order (e.g., 1) and high DC, the second one (zone R2) with low DC and grating order equal to or greater than that of the zone R1, or with no grating, see FIG. 1d.

Figure 10A:
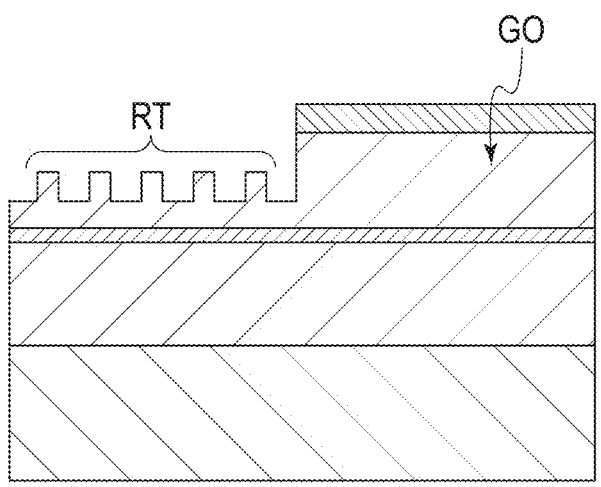
Figure 10B:
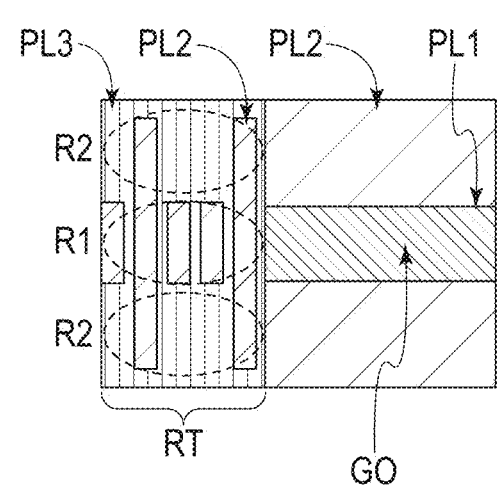

Finally, a step of dry etching the cladding not covered by the resist is carried out, thus obtaining the device illustrated in FIGS. 10a and 10b.

The etching has an appropriate depth, e.g., 150 nm.

In FIG. 10a it is possible to see the raised zone that defines the waveguide and the ridges CR that define the grating.

In particular, as can be seen in FIG. 10b, there are three different depth levels. Starting from the top, the ridge that defines the waveguide GO is encountered first at the level PL1; then, at the same level PL2, there are the lateral portions of the waveguide and the ridges of the grating; finally, the etched part of the grating is at the lowest level PL3.

Further steps of processing the laser-diode device according to the present invention will now be described with reference to FIGS. 11 to 16.

Figure 11:
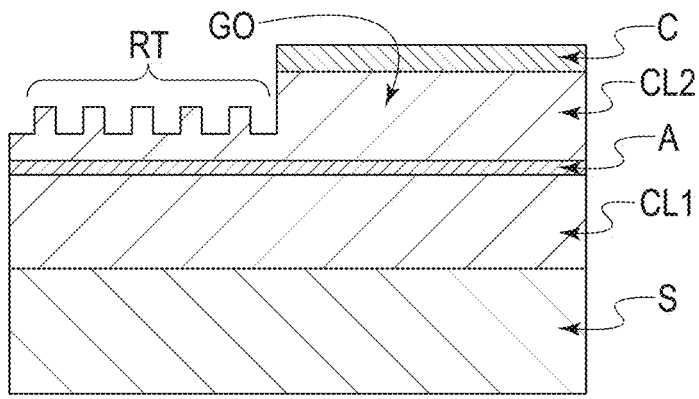
FIGS. 11 to 16 show further steps of the method for making a laser-diode device according to the present invention.

FIG. 11 illustrates the laser-diode device according to the present invention, obtained through the above-described method.

Figure 12:
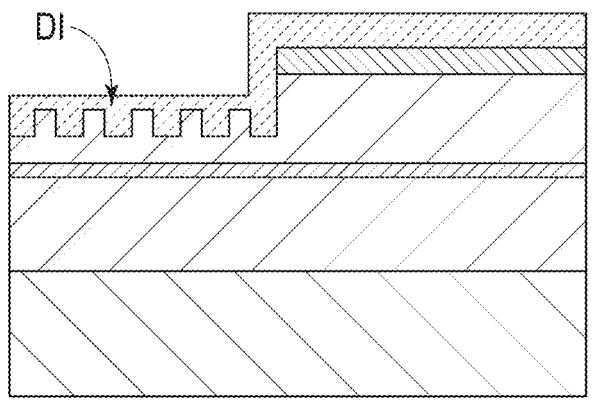

In FIG. 12, in various embodiments a layer of dielectric material DI (e.g., silicon oxide or silicon nitride) having a suitable thickness (e.g., 150-500 nm) is deposited. Deposition can be effected by using a plasma-assisted technique, such as PECVD (Plasma Enhanced Chemical Vapour Deposition), or the sputtering technique.

Figure 13:
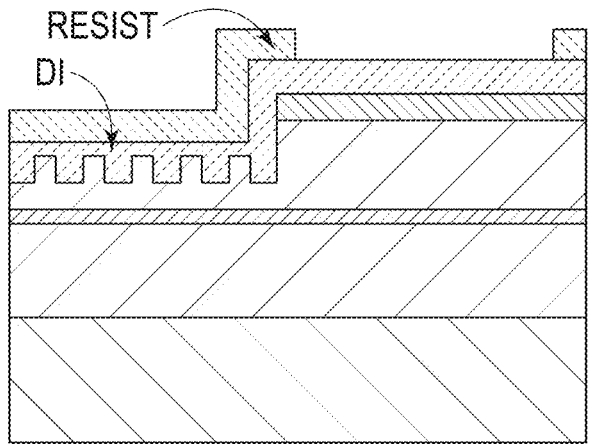

FIG. 13 shows the step of depositing, onto the dielectric material DI, a suitable layer of resist, which is lithographed and opened in the part where the waveguide GO has been created.

Figure 14:
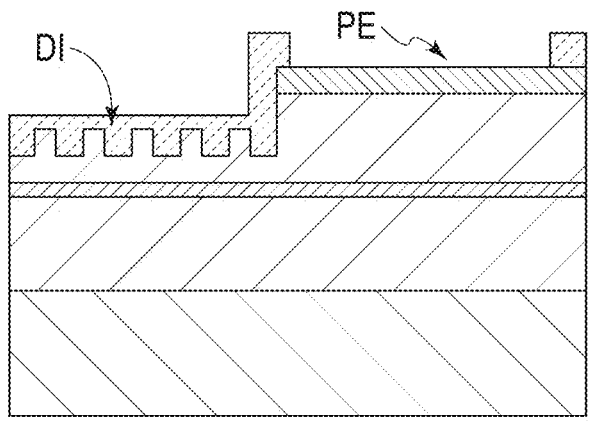

Subsequently, see FIG. 14, the dielectric is etched in order to define the electric injection zone PE on the active waveguide GO, and the resist mask is removed.

Figure 15:
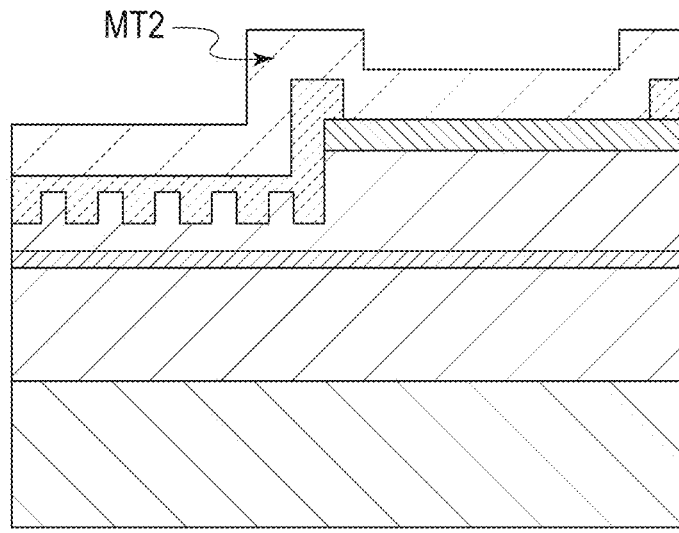

FIG. 15 illustrates the next step of depositing, onto the top side of the wafer (i.e., the side where the waveguide GO and the grating RT have been created) a metallization MT2 so as to obtain an ohmic contact on the p side of the diode. Typical p-type metallizations are Ti—Pt—Au (Titanium-Platinum-Gold).

The substrate S is then made thinner to bring it to a thickness suitable for the cleavage process (typical thickness values range from 80 to 150 μm).

Finally, a further step of depositing a metallization MT1 onto the thinned side of the substrate S is carried out, so as to obtain an ohmic contact on the n side of the diode. Typical n-type metallizations are Au—Ge—Ni—Au (Gold-Germanium-Nickel-Gold).

Figure 16:
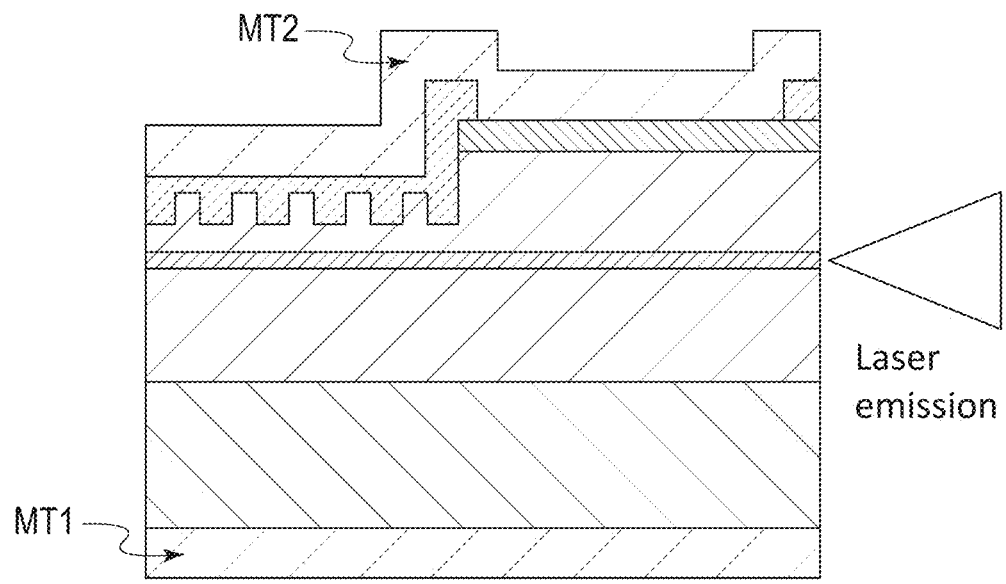

FIG. 16 shows the final device obtained through the above-described steps of the manufacturing method.

Features and advantages of the proposed solution:
integration of a DBR into a high-power semiconductor laser, engineering of effective mirror reflectivity, allowing for unbalance in the optical power emitted by the laser facets, e.g., by directing most of the power towards the front emission facet;
narrow emission spectrum; in fact, only those cavity modes having a wavelength within the reflectivity range of the grating will participate in the laser emission;
it is possible to combine beams coming from different laser diodes emitting at different wavelengths, by exploiting the wavelength control obtained through the DBR; in this manner, the quality of the combined beam, resulting from the sum of the different laser beams, may turn out to be very close to that of the individual constituent beams (preservation of the Beam Product Parameter);
fabrication of the DBR grating in a planar region through a single lithography and a single etching;
integration of the waveguide into the Bragg grating, by modelling the grating by means of a nanolithography technique, thereby reducing the insertion losses in the DBR.

Of course, without prejudice to the principle of the invention, the forms of embodiment and the implementation details may be extensively varied from those described and illustrated herein merely by way of non-limiting example, without however departing from the protection scope of the present invention as set out in the appended claims.

The invention claimed is:
1. A method for making a Distributed Bragg Reflector (DBR) laser diode with a distributed grating reflector in a planar section of a semiconductor laser with stabilized wavelength, comprising the steps of:
providing a diode formed by a substrate, at least one first cladding layer arranged on the substrate, an active layer arranged on the first cladding layer and adapted to emit an optical radiation, and at least one second cladding layer (CL2) arranged on the active layer, said cladding layers being adapted to form a heterojunction to allow for efficient injection of current into the active layer and optical confinement, and a contact layer,
creating, on a first active portion of the DBR laser diode, a waveguide to provide confinement of the optical radiation, and
creating, on a remaining passive portion of the DBR laser diode, two different gratings for light reflection and confinement, wherein:
said two gratings are laterally adjacent to each other along an optical axis of said DBR laser diode and define two different zones,
the first zone comprises a grating of low order and is intended for reflection,
the second zone comprises a grating of the same low order, or a grating of a higher order than the previous one,
a duty cycle of the first zone is higher than a duty cycle of the second zone, and
the second zone is laterally adjacent to the first zone on both sides of the first zone along the optical axis.

2. The method according to claim 1, wherein the waveguide for confining the optical radiation is implemented through a lithography and a subsequent etching.

3. The method according to claim 1, wherein making one of the grating of the first zone or the grating of the second zone requires a high-resolution lithography and a shallow etching starting from a planar zone.

4. The method according to claim 3, wherein etching of the semiconductor on parts not covered by a resist is a dry etching.

5. The method according to claim 1, wherein the active layer is preferably a quantum well structure arranged to generate optical gain across a broad wavelength spectrum.

6. The method according to claim 1, wherein the cladding layers are layers of semiconductor material.

7. The method according to claim 6, wherein said layers of semiconductor material comprise aluminium gallium arsenide on a substrate of gallium arsenide.

8. The method according to claim 1, wherein one of the grating of the first zone or the grating of the second zone is made by using a nanolithography technique, such as nano-imprinting or Electron Beam Lithography.

9. The method according to claim 1, wherein a layer of dielectric material, preferably silicon oxide or silicon nitride, is deposited on the DBR laser diode, wherein deposition is effected by using a plasma-assisted technique, such as PECVD, or a sputtering technique.

10. The method according to claim 1, wherein a plurality of metallic layers are deposited on the diode, so as to obtain an ohmic contact for the diode.

11. A Distributed Bragg Reflector (DBR) laser diode with a distributed grating reflector in a planar section of a semiconductor laser with stabilized wavelength, said DBR laser diode comprising:

a substrate, at least one first cladding layer arranged on the substrate, an active layer arranged on the first cladding layer and adapted to emit an optical radiation, and at least one second cladding layer arranged on the active layer, said cladding layers being adapted to form a heterojunction to allow for efficient injection of current into the active layer and optical confinement, and a contact layer;

a waveguide arranged on a first active portion of the DBR laser diode to provide confinement of the optical radiation; and two different gratings for light reflection and confinement arranged on a remaining passive portion of the DBR laser diode, wherein:

said two gratings are laterally adjacent to each other along an optical axis of said DBR laser diode and define two different zones, the first zone comprises a grating of low order and is intended for reflection, the second zone comprises a grating of the same low order, or a grating of a higher order than the previous one, a duty cycle of the first zone is higher than a duty cycle of the second zone, and the second zone is laterally adjacent to the first zone and on both sides of the first zone along the optical axis.

12. The DBR laser diode of claim 11, wherein a reduced volume of semiconductor material in the second zone allows for lateral optical confinement by a lower effective refractive index of the second zone in comparison to an effective refractive index of the first zone.

\* \* \* \* \*